(12) United States Patent
Kikuchi et al.

(10) Patent No.: US 8,387,562 B2
(45) Date of Patent: Mar. 5, 2013

(54) PLASMA PROCESSOR AND PLASMA PROCESSING METHOD

(75) Inventors: Akihiro Kikuchi, Nirasaki (JP); Satoshi Kayamori, Tokyo (JP); Shinya Shima, Nirasaki (JP); Yuichiro Sakamoto, Fuchu (JP); Kimihiro Higuchi, Nirasaki (JP); Kaoru Oohashi, Nirasaki (JP); Takehiro Ueda, Nirasaki (JP); Munehiro Shibuya, Nirasaki (JP); Tadashi Gondai, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/242,851

(22) Filed: Sep. 23, 2011

(65) Prior Publication Data

US 2012/0006492 A1  Jan. 12, 2012

Related U.S. Application Data

(63) Continuation of application No. 10/483,251, filed as application No. PCT/JP02/06665 on Jul. 2, 2002, now Pat. No. 8,056,503.

(30) Foreign Application Priority Data

| Jul. 10, 2001 | (JP) | 2001-210035 |
| Jul. 17, 2001 | (JP) | 2001-216424 |
| Mar. 13, 2002 | (JP) | 2002-068423 |

(51) Int. Cl.
| *C23C 16/50* | (2006.01) |
| *C23C 16/52* | (2006.01) |
| *C23F 1/00* | (2006.01) |
| *H01L 21/306* | (2006.01) |
| *C23C 16/06* | (2006.01) |
| *C23C 16/22* | (2006.01) |

(52) U.S. Cl. ............ 118/723 E; 118/724; 118/728; 156/345.43; 156/345.51; 156/345.53; 156/345.33

(58) Field of Classification Search .......... 118/723 E, 118/724, 728; 156/345.43, 345.51, 345.53, 156/345.33
See application file for complete search history.

(56) References Cited

U.S. PATENT DOCUMENTS

| 4,427,516 A | * | 1/1984 | Levinstein et al. | 204/192.38 |
| 4,565,601 A | * | 1/1986 | Kakehi et al. | 216/59 |
| 5,271,788 A | * | 12/1993 | Hasegawa et al. | 156/345.46 |
| 5,494,522 A | * | 2/1996 | Moriya et al. | 118/719 |
| 5,529,657 A | * | 6/1996 | Ishii | 156/345.26 |
| 5,531,862 A | * | 7/1996 | Otsubo et al. | 438/798 |
| 5,547,539 A | * | 8/1996 | Arasawa et al. | 438/715 |
| 5,552,124 A |   | 9/1996 | Su | |
| 5,556,500 A |   | 9/1996 | Hasegawa et al. | |
| 5,584,971 A | * | 12/1996 | Komino | 204/192.13 |

(Continued)

FOREIGN PATENT DOCUMENTS

| JP | 07-254588 | 10/1995 |
| JP | 08-254509 | 10/1996 |

(Continued)

*Primary Examiner* — Rudy Zervigon
(74) *Attorney, Agent, or Firm* — Rothwell, Figg, Ernst & Manbeck, P.C.

(57) ABSTRACT

An etching chamber 1 incorporates a focus ring 9 so as to surround a semiconductor wafer W provided on a lower electrode 4. The plasma processor is provided with an electric potential control DC power supply 33 to control the electric potential of this focus ring 9, and so constituted that the lower electrode 4 is supplied with a DC voltage of, e.g., −400 to −600 V to control the electric potential of the focus ring 9. This constitution prevents surface arcing from developing along the surface of a substrate to be processed.

12 Claims, 14 Drawing Sheets

U.S. PATENT DOCUMENTS

| | | | | |
|---|---|---|---|---|
| 5,660,740 A * | 8/1997 | Komino | ............................ | 216/67 |
| 5,835,334 A * | 11/1998 | McMillin et al. | ............... | 361/234 |
| 5,868,848 A * | 2/1999 | Tsukamoto | ................ | 118/723 E |
| 5,919,332 A * | 7/1999 | Koshiishi et al. | ......... | 156/345.47 |
| 6,081,414 A * | 6/2000 | Flanigan et al. | ............... | 361/234 |
| 6,110,287 A * | 8/2000 | Arai et al. | ................. | 156/345.34 |
| 6,113,731 A * | 9/2000 | Shan et al. | ................ | 156/345.28 |
| 6,120,660 A * | 9/2000 | Chu et al. | .................. | 204/298.15 |
| 6,344,105 B1 * | 2/2002 | Daugherty et al. | ....... | 156/345.51 |
| 6,364,957 B1 * | 4/2002 | Schneider et al. | ............ | 118/728 |
| 6,475,336 B1 * | 11/2002 | Hubacek | ................... | 156/345.51 |
| 6,549,393 B2 * | 4/2003 | Kanno et al. | .................... | 361/234 |
| 6,554,954 B2 * | 4/2003 | Ma et al. | ................. | 156/345.51 |
| 6,558,508 B1 * | 5/2003 | Kawakami | ................ | 156/345.51 |
| 6,676,804 B1 * | 1/2004 | Koshimizu et al. | ........ | 156/345.53 |
| 7,138,606 B2 * | 11/2006 | Kanno et al. | ................... | 219/390 |
| 7,244,336 B2 * | 7/2007 | Fischer et al. | ............ | 156/345.51 |
| 7,337,745 B1 * | 3/2008 | Komino et al. | ............ | 118/723 E |
| 7,658,816 B2 * | 2/2010 | Koshiishi et al. | ......... | 156/345.43 |
| 7,678,225 B2 * | 3/2010 | Nezu et al. | ................ | 156/345.47 |
| 7,713,380 B2 * | 5/2010 | Chen et al. | ................ | 156/345.53 |
| 7,727,354 B2 * | 6/2010 | Park et al. | ................. | 156/345.43 |
| 7,882,800 B2 * | 2/2011 | Koshiishi et al. | ......... | 118/723 R |
| 7,988,814 B2 * | 8/2011 | Koshiishi | ................. | 156/345.43 |
| 8,056,503 B2 * | 11/2011 | Kikuchi et al. | ............ | 118/723 E |
| 8,057,634 B2 * | 11/2011 | Nishio et al. | .............. | 156/345.44 |
| 2002/0029745 A1 * | 3/2002 | Nagaiwa et al. | ........... | 118/723 E |
| 2004/0177927 A1 * | 9/2004 | Kikuchi et al. | ........... | 156/345.51 |
| 2005/0061447 A1 * | 3/2005 | Kim et al. | ................. | 156/345.51 |
| 2005/0095732 A1 * | 5/2005 | Maebashi et al. | ................. | 438/17 |
| 2005/0103275 A1 * | 5/2005 | Sasaki et al. | .................. | 118/728 |
| 2005/0172904 A1 * | 8/2005 | Koshimizu et al. | ............ | 118/728 |
| 2006/0043067 A1 * | 3/2006 | Kadkhodayan et al. | ......... | 216/67 |
| 2006/0283549 A1 * | 12/2006 | Aramaki et al. | .......... | 156/345.28 |
| 2007/0000614 A1 * | 1/2007 | Hatamura et al. | ........ | 156/345.51 |
| 2007/0051471 A1 * | 3/2007 | Kawaguchi et al. | ...... | 156/345.36 |
| 2007/0169891 A1 * | 7/2007 | Koshiishi et al. | ......... | 156/345.47 |
| 2010/0025369 A1 * | 2/2010 | Negishi et al. | ................... | 216/60 |
| 2010/0304572 A1 * | 12/2010 | Koshimizu | .................... | 438/710 |
| 2012/0006492 A1 * | 1/2012 | Kikuchi et al. | ........... | 156/345.51 |

FOREIGN PATENT DOCUMENTS

| | | | |
|---|---|---|---|
| JP | 08293539 A | * | 11/1996 |
| JP | 11-135483 | | 5/1999 |
| JP | 11158662 A | * | 6/1999 |
| JP | 2000036490 A | * | 2/2000 |
| JP | 2000-164583 | | 6/2000 |
| JP | 2001308079 A | * | 11/2001 |
| JP | 2003133398 A | * | 5/2003 |
| JP | 2008172240 A | * | 7/2008 |
| JP | 2009224385 A | * | 10/2009 |
| JP | 2010183074 A | * | 8/2010 |
| JP | 2010186841 A | * | 8/2010 |
| JP | 2010232694 A | * | 10/2010 |
| JP | 2011176228 A | * | 9/2011 |

* cited by examiner

FIG.8

|       | 0V  | 100V | 200V | 300V | 400V | 500V | 600V | 700V | 800V | 900V | 1000V |
|-------|-----|------|------|------|------|------|------|------|------|------|-------|
| 800W  | 0   | 100  | 200  | 300  | 400  | 500  | 600  | 700  | 800  | 900  | 1000  |
| 1000W | 6   | 100  | 200  | 300  | 400  | 500  | 600  | 700  | 800  | 900  | 1000  |
| 1200W | 15  | 103  | 200  | 300  | 400  | 500  | 600  | 700  | 800  | 900  | 1000  |
| 1500W | 25  | 110  | 200  | 300  | 400  | 500  | 600  | 700  | 800  | 900  | 1000  |
| 1700W | 60  | 119  | 204  | 304  | 400  | 500  | 600  | 700  | 800  | 900  | 1000  |
| 2000W | 117 | 129  | 213  | 306  | 400  | 500  | 600  | 700  | 800  | 900  | 1000  |
| 2350W | 156 | 169  | 227  | 313  | 403  | 500  | 600  | 700  | 800  | 900  | 1000  |

PLASMA PROCESSOR AND PLASMA PROCESSING METHOD

CROSS-REFERENCE(S) TO RELATED APPLICATIONS

This application is a continuation application of U.S. application Ser. No. 10/483,251, filed on May 6, 2004, now U.S. Pat. No. 8,056,503, issued on Nov. 15, 2001, the entire content of which is incorporated herein by reference. U.S. application Ser. No. 10/483,251 is a National Stage of PCT/JP02/06665 filed on Jul. 2, 2002 and claims priority to Japanese Patent Applications No. 2001-210035, filed on Jul. 10, 2001, No. 2001-216424, filed on Jul. 17, 2001 and No. 2002-68423, filed on Mar. 13, 2002; the entire contents of these applications are being incorporated herein by reference.

FIELD OF THE INVENTION

The present invention relates to a plasma processing apparatus and a plasma processing method for processing a substrate to be processed, e.g., a semiconductor wafer, by using a plasma.

BACKGROUND OF THE INVENTION

A plasma processing apparatus and a plasma processing method have been widely used for processing a substrate, e.g., a semiconductor wafer, by using a plasma. For example, an etching apparatus is commonly used in a semiconductor device manufacturing process as a technique for forming fine electric circuits on the semiconductor wafer by etching and removing a thin film formed on a semiconductor wafer by using a plasma.

Such an etching apparatus includes a processing chamber (an etching chamber) whose inner space can be air-tightly sealed such that a plasma is generated in the etching chamber. A semiconductor wafer is mounted on a susceptor installed in the etching chamber and then etched.

Among many known various types of apparatuses for generating the plasma, there is an apparatus which generates a plasma by supplying a high frequency power to a pair of upper and lower parallel plate electrodes facing each other, wherein one of the parallel electrodes, e.g., the lower electrode, serves as a susceptor. A semiconductor wafer is mounted on the lower electrode and a high frequency voltage is applied between the parallel plate electrodes to generate a plasma so that an etching process can be performed.

Further, such etching apparatus may have a focus ring formed of a ring shape and disposed to surround the periphery of the semiconductor wafer, wherein the focus ring serves to concentrate (focus) a plasma on a surface of a semiconductor wafer surface.

FIG. 19 schematically illustrates a cross-sectional view of principal parts of an etching apparatus having the focus ring as described above. As shown in FIG. 19, an electrostatic chuck 151 is installed on a top surface of a lower electrode 150 serving as a susceptor. The electrostatic chuck 151 has a dielectric layer 151a made of resin, ceramic, or the like and a flat plate electrode of electrostatic chuck 151b embedded in the dielectric layer 151a.

A semiconductor wafer W is adsorptively supported on the electrode chuck 151 and the focus ring 152 is installed to surround the semiconductor wafer W that has been adsorptively supported on the electrode chuck 151. Reference numeral 153 indicates an insulating member.

However, in the above conventional etching apparatuses, a plasma induces a considerable electric potential difference between electric potentials of the semiconductor wafer W and the focus ring 152 during an etching process, and the electric potential difference leads to a so-called surface arcing that causes an abnormal discharge between a surface of the semiconductor wafer W and the focus ring 152.

For example, in case an insulating layer is formed on a conductive layer and then etched, for example, an insulating film formed of a silicon oxide film is etched to form a contact hole communicating with an underlying conductive layer made of a metal, the surface arcing frequently occurs between the underlying metal layer and the focus ring by destroying the silicon oxide film whose thickness is decreased by the etching.

If the abnormal discharge occurs, large portions of the silicon oxide film of the semiconductor wafer are destroyed and most devices of the semiconductor wafer become defective. Further, the inside of the etching chamber is contaminated with metal contaminants, which in turn makes it impossible to continue the etching process without cleaning the etching chamber, thereby significantly deteriorating overall productivity.

In order to measure the aforementioned electric potential difference between the semiconductor wafer and the focus ring, there was provided a semiconductor wafer having at a surface thereof an underlying layer (an insulating layer), a metal layer formed on the underlying layer, and a silicon oxide film layer that is an insulating layer formed on the metal layer. And by using as an etching gas a gaseous mixture of $C_4F_8$ (flow rate of 10 sccm), CO (flow rate of 50 sccm), Ar (flow rate of 200 sccm), and $O_2$ (flow rate of 5 sccm), the silicon oxide film was etched to form a contact hole under a condition of a pressure of 5.99 Pa (45 mTorr) and a high frequency power of 1500 W. The resultant electric potential difference measured between the semiconductor wafer and the focus ring in the etching process was about 30-40 V.

The arcing may hardly occur under such an electric potential difference. However, the arcing may be caused by some other factors, e.g., in a case where a semiconductor wafer is eccentrically placed with respect to a lower electrode and, thus, a gap between a peripheral portion of the semiconductor wafer and the focus ring becomes locally narrower and/or in a case where a plasma is ununiformly generated by any cause. As described above, once the arcing occurs, the etching chamber needs to be cleaned. Therefore, the arcing should be completely prevented.

While a plasma processing apparatus performs an etching process on a semiconductor wafer or the like by using a plasma, the temperature of the semiconductor wafer or the like can be undesirably increased. Accordingly, many of the plasma processing apparatus have a temperature control mechanism for cooling the semiconductor wafer being etched.

FIG. 20 depicts an enlarged view of principal parts of a parallel plate etching apparatus equipped with such a temperature control mechanism. As illustrated in FIG. 20, a semiconductor wafer W is mounted on a lower electrode (a susceptor) 200 and then etched by a plasma generated by applying a high frequency power between an upper electrode (not shown) and the lower electrode.

Installed on the lower electrode 200 is an electrostatic chuck 8 for adsorptively supporting the semiconductor wafer W. The semiconductor wafer W is attracted thereon by the Coulomb force or the Johnson-Rahbeck force being generated by applying a high DC voltage to an electrode of electrostatic chuck 8b.

A coolant path 210 for circulating a coolant is formed inside the lower electrode 200 so that the lower electrode 200 can be cooled down to a predetermined temperature. Further, a gas channel 220 for supplying a cooling gas such as a He gas is formed at the lower electrode 200. The gas channel 220 supplies a cooling gas, e.g., a He gas, between a backside of the semiconductor wafer W and the lower electrode 200 (the electrostatic chuck 8) in order to carry out an efficient heat exchange with the semiconductor wafer W and efficiently and precisely control the temperature of the semiconductor wafer W.

Furthermore, the gas channel 220 has a dual system of a peripheral portion gas channel 220a and a central portion gas channel 220b so that it is possible to change pressures of the cooling gases provided from the peripheral portion and the central portion of the semiconductor wafer W, respectively.

The lower electrode 200 is formed in an approximately circular plate in general and made of a metal such as aluminum having an anodic oxidized (alumite-treated) surface. Further, in order to install the coolant path 210 and the gas channel 220 inside the lower electrode 200, the lower electrode 200 is embodied by jointing three members, i.e., an upper plate 201, an intermediate plate 202 and a lower plate 203 (each being an approximately circular plate). And the coolant path 210 is formed by blocking an opening of each groove formed in a bottom surface of the intermediate plate 202 by the lower plate 203.

Meanwhile, the gas channel 220 has a gas storage 221 formed inside the lower electrode 200; a gas inlet circular hole 222 for introducing a gas from a bottom portion of the mounting table 200 to the gas storage 221; and a plurality of gas supply fine holes 223 for supplying the gas from the gas storage 221 to a backside of the semiconductor wafer W. The gas storage 221 is formed by blocking an opening of a groove formed in a bottom surface of the upper plate 201 by the intermediate plate 202.

In the above-described etching apparatus, a temperature of the lower electrode is controlled by circulating a coolant within the coolant path 210. Further, a temperature of the semiconductor wafer W can be efficiently and accurately controlled by a cooling gas being collected in the gas storage 221 through the gas inlet circular hole 222 and then supplied from the gas storage 221 to the backside of the semiconductor wafer W through the plurality of gas supply fine holes 223.

However, the inventors have found that, in the etching apparatus illustrated in FIG. 20, there occurs an abnormal discharge between the backside of the semiconductor wafer W and a bottom portion of the gas storage 221 via the gas supply fine holes 223.

A discharge at the backside of the semiconductor wafer W may inflict damages on each member and, at the same time, lead to an occurrence of the arcing on a surface of the semiconductor wafer W. In other words, the discharge at the backside of the semiconductor wafer W may cause a dielectric breakdown of an interlayer insulating film inside the semiconductor wafer W and a lighting-like discharge (surface arcing) from a plasma and the like may occur on the portion of the dielectric breakdown.

SUMMARY OF THE INVENTION

It is, therefore, an object of the present invention to provide a plasma processing apparatus and a plasma processing method, which are capable of preventing an undesired discharge from occurring on a substrate to be processed and improving a productivity in comparison with the prior art.

In accordance with one aspect of the invention, there is provided a plasma processing apparatus including: a processing chamber for generating a plasma therein; a susceptor, installed in the processing chamber, for mounting thereon a substrate to be processed; a vertically movable substrate support member, installed in the susceptor, for supporting the substrate above the susceptor; and a controller for preventing an occurrence of an abnormal discharge by controlling at least one of a pressure and a distance between a top end of the substrate support and a backside of the substrate.

Further, the plasma processing apparatus of the present invention may includes a focus ring disposed on a peripheral portion of the susceptor to surround a periphery of the substrate; and a DC voltage application unit for controlling an electric potential of the focus ring while a plasma processing is performed on the substrate by using the plasma.

In the plasma processing apparatus of the present invention, the DC voltage application unit may apply a DC voltage to the focus ring via the susceptor.

Further, in the plasma processing apparatus of the present invention, the focus ring may be made of silicon, silicon carbide or a silicon dioxide.

The plasma processing apparatus of present invention may include a DC voltage application unit for applying a DC voltage corresponding to an electric potential of the surface of the substrate to the susceptor.

The plasma processing apparatus may include table data representing a relationship between a high frequency power applied to an electrode in the processing chamber and an electric potential of the surface of the substrate at a time when the high frequency power is applied, and the DC voltage corresponding to the electric potential of the surface of the substrate may be applied based on the table data.

Further, in the plasma processing apparatus of the present invention, the susceptor may be connected to a ground potential via a resistance and a DC current due to the DC voltage applied to the susceptor flows to the ground.

The plasma processing apparatus of the present invention may further include a gas storage, formed inside the susceptor, for supplying a cooling gas to a mounting surface of the susceptor, wherein the controller prevents the occurrence of the abnormal discharge by controlling at least one of a voltage owing to a high frequency power applied to an electrode in the processing chamber and a pressure between a bottom portion of the gas storage and the backside of the substrate.

In the plasma processing apparatus of the present invention, a distance between the bottom portion of the gas storage and the backside of the substrate may be greater than or equal to 10 mm.

The plasma processing apparatus of the present invention may further include a coolant path, formed inside the susceptor, for circulating a coolant; and a cooling gas channel including a gas storage formed under the coolant path inside the susceptor, a plurality of gas supply fine holes for supplying a cooling gas from the gas storage to a mounting surface of the susceptor, and a gas inlet portion for introducing the cooling gas into the gas storage.

In the plasma processing apparatus of the present invention, a plurality of fine grooves, matching with the gas supply fine holes, for diffusing a cooling gas are formed on the placing surface of the susceptor.

Further, in the plasma processing apparatus of the present invention, a depth of the fine grooves may be smaller than or equal to 1 mm.

In accordance with another aspect of the invention, there is provided a plasma processing apparatus including: a processing chamber for generating a plasma therein; a susceptor, installed in the processing chamber, for mounting thereon a substrate to be processed; a focus ring disposed on a peripheral portion of the susceptor to surround a periphery of the substrate; and a DC voltage application unit for controlling an electric potential of the focus ring while a plasma process is performed on the substrate by using the plasma.

In the plasma processing apparatus of the present invention, the DC voltage application unit may apply a DC voltage to the focus ring via the susceptor.

Further, in the plasma processing apparatus of the present invention, the focus ring may be made of silicon, silicon carbide or silicon dioxide.

In accordance with still another aspect of the invention, there is provided a plasma processing apparatus including: a processing chamber for generating a plasma therein; a susceptor, installed in the processing chamber, for mounting thereon a substrate to be processed; and a DC voltage application unit for applying a DC voltage decreasing an electric potential difference between a surface of the substrate and the susceptor to the susceptor, wherein the plasma processing apparatus includes table data representing a relationship between a high frequency power applied to an electrode in the processing chamber and an electric potential of the surface of the substrate at a time when the high frequency power is applied, and the DC voltage by the DC voltage application unit may be applied based on the table data.

Further, in accordance with still another aspect of the invention, there is provided a plasma processing apparatus including: a processing chamber for generating a plasma therein; a susceptor, installed in the processing chamber, for mounting thereon a substrate to be processed; and a DC voltage application unit for applying a DC voltage decreasing an electric potential difference between a surface of the substrate and the susceptor to the susceptor, wherein the susceptor is connected to a ground potential via a resistance and a DC current due to the DC voltage applied to the susceptor flows to the ground.

In accordance with still another aspect of the invention, there is provided a plasma processing apparatus including: a processing chamber for accommodating a substrate to be processed and performing a plasma processing thereon; a susceptor installed inside the processing chamber for mounting thereon the substrate, the susceptor serving as electrode; a coolant path, formed inside the susceptor, for circulating a coolant; and a cooling gas channel including a gas storage formed under the coolant path inside the susceptor, a plurality of gas supply fine holes for supplying a cooling gas from the gas storage to a mounting surface of the susceptor, and a gas inlet portion for introducing the cooling gas into the gas storage.

In the plasma processing apparatus of the present invention, a plurality of fine grooves, matching with the gas supply fine holes, for diffusing a cooling gas are formed on the placing surface of the susceptor.

Further, in the plasma processing apparatus of the present invention, a depth of the fine grooves may be smaller than or equal to 1 mm.

Furthermore, in the plasma processing apparatus of the present invention, a distance between the mounting surface of the susceptor and a bottom portion of the gas storage may be greater than or equal to 10 mm.

In accordance with still another aspect of the invention, there is provided a plasma processing apparatus including: a processing chamber for generating a plasma therein; a susceptor, installed in the processing chamber, for mounting thereon a substrate to be processed; and a focus ring disposed on a peripheral portion of the susceptor to surround a periphery of the substrate, wherein the focus ring at least includes: a first ring member having a surface exposed to the plasma; and a second ring member disposed further away from the plasma than the first ring member, a small gap being provided between the first and the second ring member.

In the plasma processing apparatus of the present invention, the focus ring may further include a third ring member for mounting thereon the first ring member and providing the small gap between the first ring member and the second ring member installed under the first ring member.

Further, in the plasma processing apparatus of the present invention, the third ring member may be installed at a side of an outer circumference of the second ring member. Moreover, in the plasma processing apparatus of the present invention, each of the first and the second ring member may be made of a conductive material.

In addition, in the plasma processing apparatus of the present invention, the third ring member may be made of an insulating material.

In accordance with still another aspect of the invention, there is provided a plasma processing method including the steps of generating a plasma in a processing chamber and performing a plasma processing on a substrate to be processed that is mounted on a susceptor installed in the processing chamber; wherein an abnormal discharge is prevented by controlling at least one of a pressure and a distance between a top end of a vertically movable substrate support member and a backside of the substrate, the vertically movable substrate support member being installed in the susceptor.

BRIEF DESCRIPTION OF THE DRAWINGS

FIG. 8 provides measured values obtained by the susceptor electric potential monitor;

DETAILED DESCRIPTION OF THE PREFERRED EMBODIMENTS

Hereinafter, preferred embodiments of the present invention will be described in detail with reference to the accompanying drawings.

Figure 1:
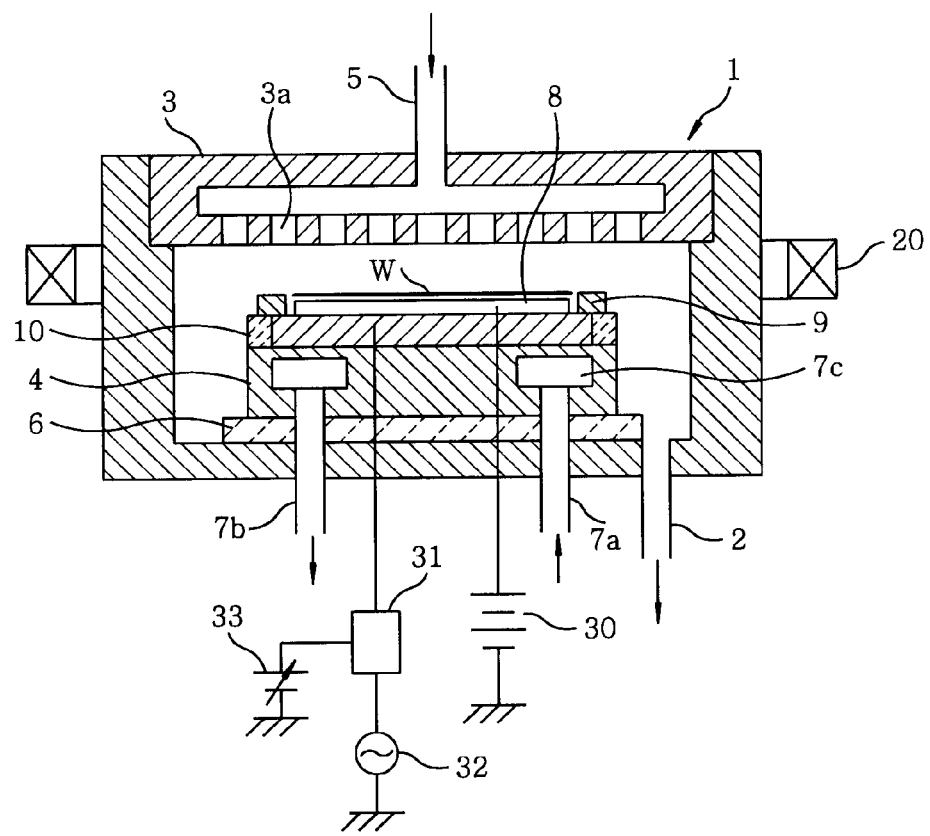
FIG. 1 schematically shows an overall configuration of a plasma etching apparatus in accordance with a preferred embodiment of the present invention.

FIG. 1 schematically illustrates an overall configuration of a dipole magnetron plasma etching apparatus in accordance with a first preferred embodiment of the present invention. Reference numeral 1 indicates an etching chamber (a processing chamber). The etching chamber 1 is made of aluminum or the like of a cylindrical shape, and an inner portion thereof can be air-tightly sealed. Installed in a bottom portion of the etching chamber 1 is an exhaust line 2 connected to a vacuum pump (not shown) that is not illustrated, so that an inner space of the etching chamber 1 can be exhausted to a predetermined level of vacuum state.

Further, installed at a top portion and at the bottom portion of the etching chamber 1 are an upper electrode 3 facing downward and a lower electrode 4 facing the upper electrode 3, respectively.

The upper electrode 3 is formed in a circular disc shape having a hollow inner portion. A plurality of gas supply openings 3a are formed in a lower side of the upper electrode 3 so as to be included as a part of a so-called shower head. The upper electrode 3 is grounded. A gas inlet line 5 is connected to the upper electrode 3 so as to communicate with the hollow inner portion of the upper electrode 3. An etching gas provided from an etching gas source (not shown) is introduced into the hollow portion of the upper electrode 3 via the gas inlet line 5. The etching gas is then uniformly distributed into the etching chamber 1 through the gas injection openings 3a.

Further, the lower electrode 4 is installed on an insulating plate 6 made of, e.g., ceramic, the insulating plate 6 being installed on the bottom portion of the etching chamber 1. The lower electrode 4 is made of a conductive material, e.g., aluminum. Further, the lower electrode 4 has a temperature control medium circulating mechanism including a temperature control medium introducing line 7a, a temperature control medium exhaust line 7b, and a temperature control medium channel 7c, so that it is possible to control a temperature of a semiconductor wafer W to be kept at a desired level.

An electrostatic chuck 8 is installed on a top surface of the lower electrode 4, so that the semiconductor wafer W can be adsorptively supported on the top surface thereof. In other words, the semiconductor wafer W is substantially mounted on the lower electrode 4 which also serves as a so-called susceptor.

The periphery of the semiconductor wafer adsoprtively supported on the electrostatic chuck 8 is surrounded by a focus ring 9 made of silicon (Si), silicon carbide (SiC), silicon dioxide ($SiO_2$) or the like of a ring shape. Furthermore, the periphery of the lower electrode 4 is surrounded by an insulating member 10 made of, e.g., quartz.

In addition, installed at an outer portion of a sidewall of the etching chamber 1 is a dipole permanent magnet set 20 comprised of a plurality of permanent magnets arranged in a ring pattern. The dipole permanent magnet set is circumferentially rotatable, e.g., at a rotational speed of 20 rpm by a rotary driving unit (not shown).

The electrostatic chuck 8 is connected to a power supply 30 for the electrostatic chuck 8 which applies a high DC voltage of, e.g., 2.4 kV. The lower electrode 4 is connected to a high frequency power supply 32 via a matching circuit 31.

Further, in the first preferred embodiment, there is provided an electric potential control DC power supply (a DC voltage application unit) 33 for controlling an electric potential of the focus ring 9. The electric potential of the focus ring 9 can be controlled by supplying a DC voltage from the electric potential control DC power supply 33 to the lower electrode 4. The control of the electric potential of the focus ring 9 is performed to reduce an electric potential difference between the focus ring 9 and the semiconductor wafer W, for example.

Figure 2:
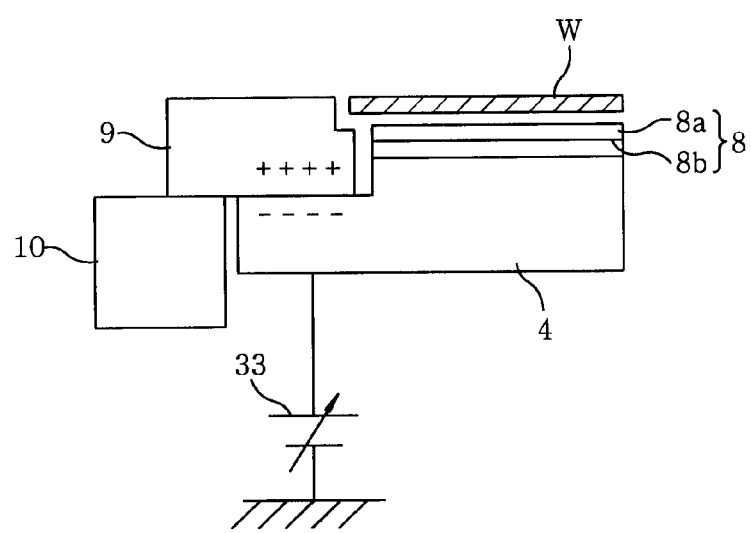
FIG. 2 schematically illustrates an enlarged view of principal parts of the plasma etching apparatus of FIG. 1.

FIG. 2 is a schematic enlarged view showing a configuration of principal parts near the focus ring 9 of the aforementioned apparatus. As illustrated in FIG. 2, the focus ring 9 is mounted on both a peripheral portion of the lower electrode 4 made of, e.g., aluminum and an insulating member 10 surrounding the peripheral portion thereof.

The electrostatic chuck 8 provided on the top surface of the lower electrode 4 has a dielectric layer 8a made of resin, ceramic or the like, and a flat plate electrode 8b for the electrostatic chuck 8, the electrode 8b being embedded in the dielectric layer 8a.

A DC voltage is applied from the electric potential control DC power supply 33 to the lower electrode 4. By applying, e.g., the DC voltage ranging from −400 to −600 V, to the lower electrode 4, it is possible to control the electric potential of the focus ring 9 such that the electric potential difference between the focus ring 9 and the semiconductor wafer W can be reduced.

Figure 3:
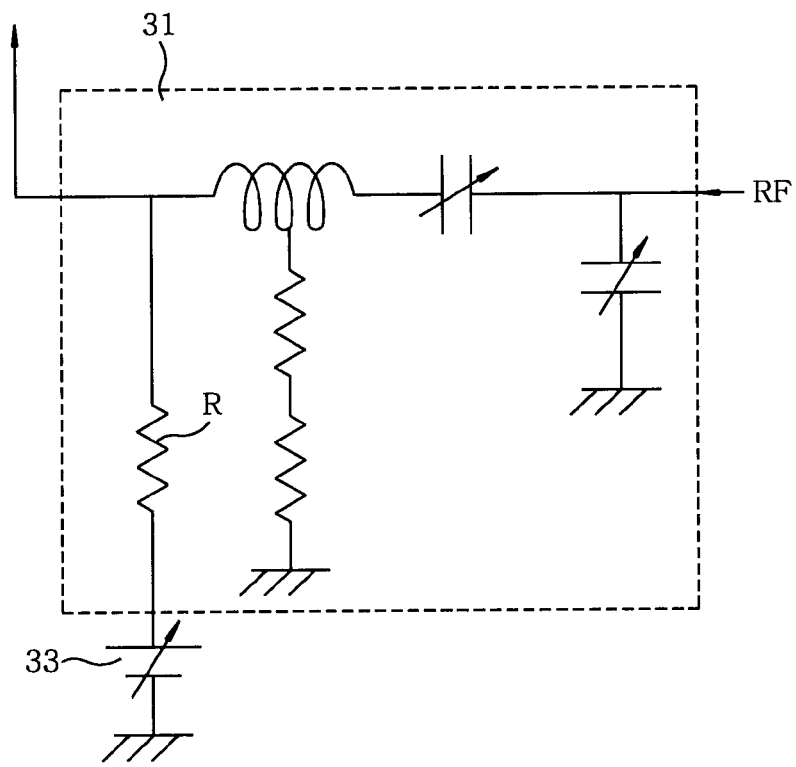
FIG. 3 describes a circuit diagram of a voltage application circuit incorporating therein an electric potential control DC power supply.

FIG. 3 describes a circuit diagram of a voltage application unit incorporating therein the electric potential control DC power supply 33. In this preferred embodiment, the electric potential control DC power supply 33 is connected to an output side of the matching circuit 31 via a resistance R, wherein the matching circuit 31 performs a matching of a high frequency power applied from the high frequency power supply 32 to the lower electrode 4. The connection structure need not be restricted to the above-described structure and may be varied so long as an output voltage of the electric potential control DC power supply 33 can be applied to the lower electrode 4.

In the above-described dipole magnetron plasma etching apparatus, a semiconductor wafer W as a substrate to be processed is mounted into the etching chamber 1 via a load-lock chamber (not shown) after opening a gate valve (not shown). Then, the semiconductor wafer W is placed on the electrostatic chuck 8 and adsorptively supported thereon.

After closing the gate valve, the etching chamber 1 is evacuated through the exhaust line 2 and, at the same time, an etching gas is supplied thereinto from the gas inlet line 5 via the gas supply openings 3a. Next, a high frequency power of, e.g., 13.56 MHz, is supplied from the high frequency power supply 32 to the lower electrode 4, thereby making the etching gas become a plasma.

At the same time, the plasma is uniformed by a magnetic field obtained by rotating the dipole permanent magnet set 20. Then, the semiconductor wafer W is uniformly etched by the uniformed plasma.

During the etching process, the electric potential of the focus ring 9 is controlled by applying the DC voltage from the electric potential control DC power supply 33 to the lower electrode 4, thereby preventing an occurrence of the surface arcing between the focus ring 9 and the semiconductor wafer W.

The semiconductor wafer W involved herein has at a surface thereof an underlying layer (an insulating layer), a metal layer formed on the underlying layer, and a silicon oxide film layer that is an insulating layer formed on the metal layer. Used as an etching gas in an etching process for forming a contact hole was a gaseous mixture of $C_4F_8$ (flow rate of 10 sccm), CO (flow rate of 50 sccm), Ar (flow rate of 200 sccm), and $O_2$ (flow rate of 5 sccm). The etching process was carried out by etching the silicon oxide film layer of the semiconductor wafer W under the condition of a pressure of 2.66 Pa (20 mTorr) and a high frequency power of 2400 W.

The above etching condition is susceptible to the surface arcing due to its lower pressure and a higher high frequency power than those in a conventional etching condition (75 mTorr, 1500 W).

In case the etching process was performed without the DC voltage being applied from the electric potential control DC power supply 33, an electric potential difference between the semiconductor wafer W and the focus ring 9 was about 40 V, and an incidence rate of the surface arcing was 40% [four out of ten semiconductor wafers W].

On the other hand, in case the etching was performed with the DC voltage of −500 V being applied from the electric potential control DC power supply 33 in the etching process of this preferred embodiment, the electric potential difference between the semiconductor wafer W and the focus ring 9 was smaller than or equal to 20 V and an incidence rate of the surface arcing was 0%.

As can be clearly seen from the above result, with the DC power applied from the electric potential control DC power supply 33, it is possible to reduce the electric potential difference between the semiconductor wafer W and the focus ring 9 and prevent the occurrence of the surface arcing.

Furthermore, in the above example, the etching was performed while varying an applied voltage within a range from +3000 to −3000 V in order to examine an optimal applying voltage from the electric potential control DC power supply 33. As a result, the optimal result was obtained in case the applied voltage was in the range from −400 to −600 V. In other words, when the voltage ranging from −400 to −600 V was applied, the electric potential difference between the semiconductor wafer W and the focus ring 9 was smaller than or equal to 20 V and the incidence rate of the occurrence of the surface arcing was 0%.

Hereinafter, a second preferred embodiment of the present invention will be described.

Figure 4:
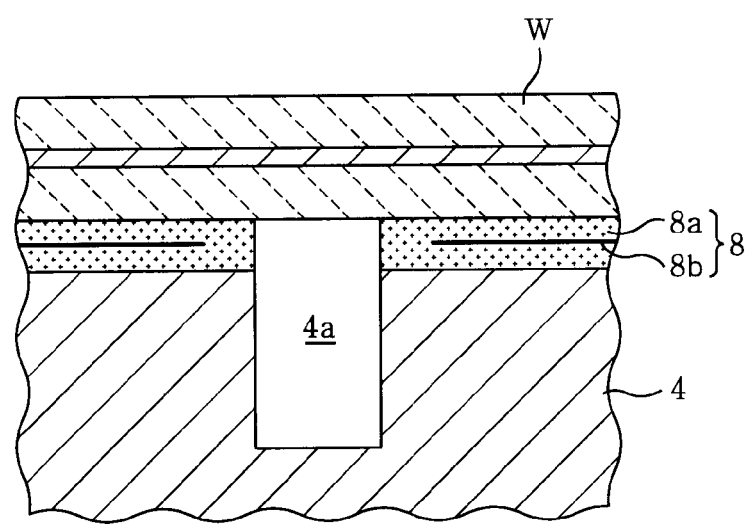
FIG. 4 schematically depicts an enlarged view of principal parts of the plasma etching apparatus of FIG. 1.

FIG. 4 schematically depicts an enlarged cross-sectional view of the lower electrode (a susceptor) 4 and the semiconductor wafer W. As illustrated in FIG. 4, a gas channel 4a for supplying a cooling gas (a He gas or the like) to a backside of the semiconductor wafer W are formed in the lower electrode 4. Thus, the electrostatic chuck 8 is not installed at portions occupied by the gas channel 4a. Similarly, the electrostatic chuck 8 is not provided at portions occupied by holes formed therein for accommodating therein supporting members (e.g., pins) for supporting the semiconductor wafer W on the lower electrode 4.

Figure 5:
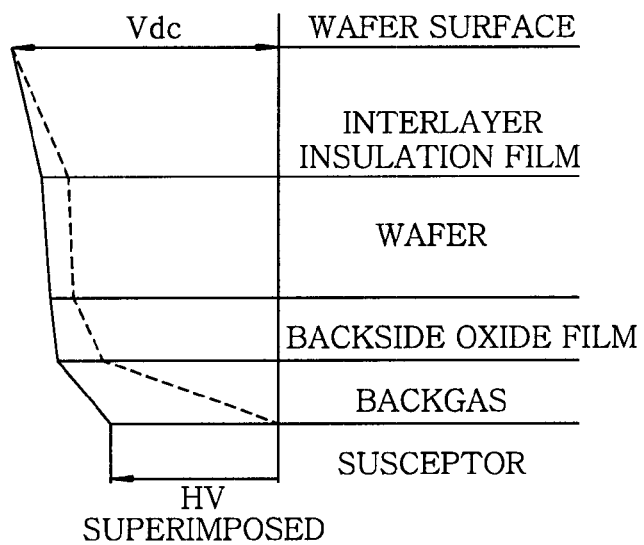
FIG. 5 presents a diagram showing electric potentials of respective portions in a semiconductor wafer.

Accordingly, portions of the semiconductor wafer W located above the gas channel 4a and the like are in an electrically different state from that of portions of the semiconductor wafer W placed above the electrostatic chuck 8 (the electrostatic chuck electrode 8b). FIG. 5 schematically depicts electric potentials of the portions of the semiconductor wafer W above the gas channel 4a. As shown in FIG. 5, the surface of the semiconductor wafer W has a electric potential Vdc determined by a plasma state, and such electric potential Vdc normally ranges, e.g., from −400 to −600 V.

In case a DC voltage is not superimposed, the lower electrode 4 has the ground potential. Accordingly, there is an electric potential difference ranging from 400 V to 600 V between the surface of the semiconductor wafer W and the lower electrode 4. Further, electric potentials of respective portions in the semiconductor wafer W are indicated by a dotted line in FIG. 5.

On the other hand, in case the DC voltage HV is superimposed on the lower electrode 4, an electric potential difference between the surface of the semiconductor wafer W and the lower electrode 4 is reduced as illustrated by a solid line in FIG. 5 and the electric potential differences of the respective portions in the semiconductor wafer W are also decreased. Thus, a vertical electric potential difference applied to an interlayer insulation film inside the semiconductor wafer W is also decreased, thereby greatly reducing a possibility of the dielectric breakdown.

Figure 6:
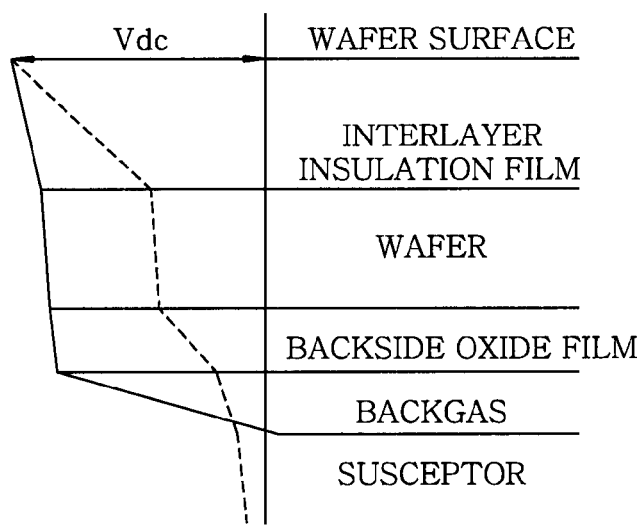
FIG. 6 represents a diagram illustrating electric potentials of respective portions in the semiconductor wafer when a discharge occurs.

Further, in case the DC voltage is not superimposed on the lower electrode 4, the electric potential difference is generated between the lower electrode 4 having the ground potential and the backside of the semiconductor wafer W [a portion of the gas channel 4a (a backgas)] as indicated by a solid line in FIG. 6, so that a discharge may occur therebetween.

If the discharge occurs at the portion of the backgas, the electric potentials of respective portions in the semiconductor wafer W as indicated by the solid line in FIG. 6 are changed as indicated by a dotted line in FIG. 6 due to a decrease in an impedance of the backgas portion, and the electric potential difference between the backside of the semiconductor wafer W and the ground potential is decreased.

Accordingly, the vertical electric potential difference applied to the interlayer insulation film inside the semiconductor wafer W is increased, thereby highly augmenting the possibility of the dielectric breakdown.

Even though there occurs no dielectric breakdown in the interlayer insulation film, a discharge most likely inflicts damages on the lower electrode 4 and/or the semiconductor wafer W. Therefore, the discharge at the backside of the semiconductor wafer W also needs to be prevented.

Figure 7:
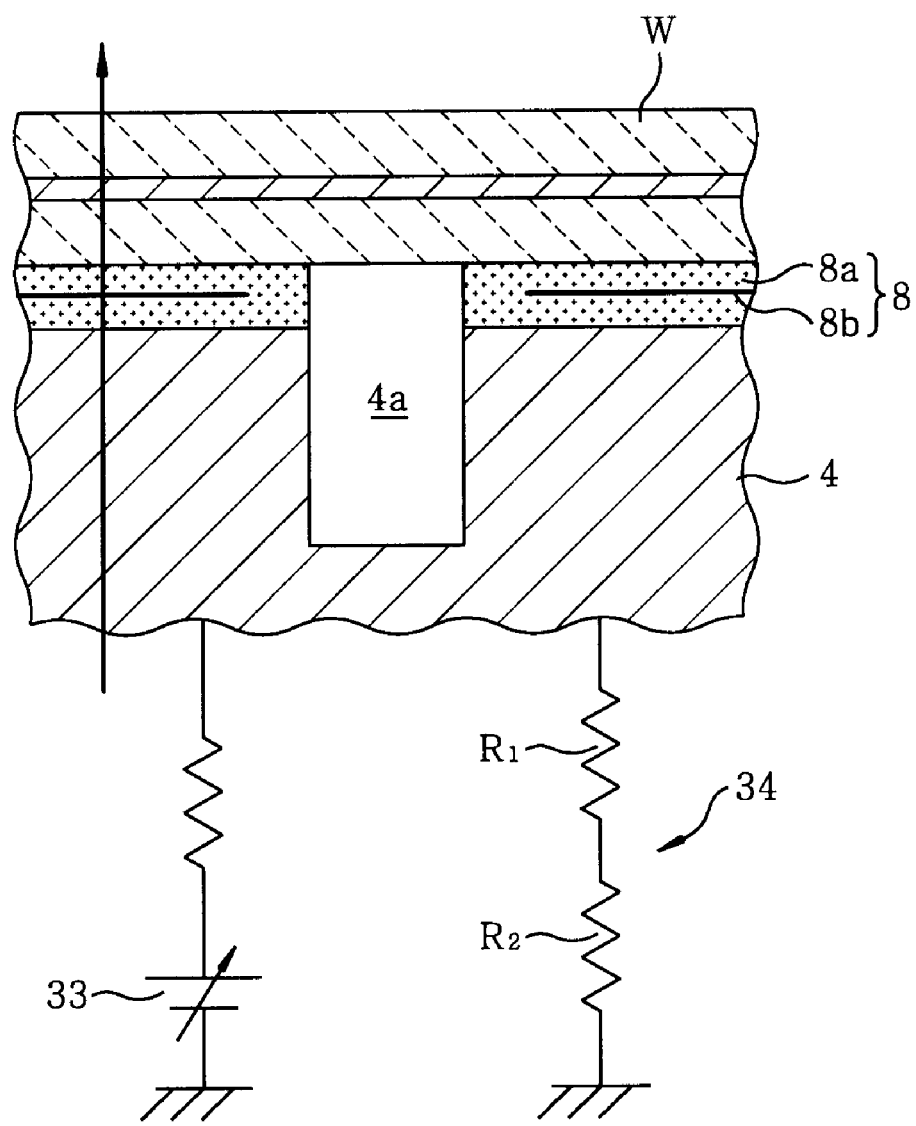
FIG. 7 offers a diagram showing a configuration of a susceptor electric potential monitor.

Thus, it is preferable to superimpose a DC voltage on the lower electrode 4 corresponding to a surface electric potential Vdc of the semiconductor wafer W determined based on a plasma state. If the DC voltage is superimposed on the lower electrode 4 as described above, a minute amount of DC current due to the superimposed DC voltage may flow from the lower electrode 4 across the semiconductor wafer W as shown by an arrow in FIG. 7. However, in case the DC current flows across the semiconductor wafer W, there is a strong possibility that the interlayer insulation film of the semiconductor wafer W may be damaged.

For this reason, it is preferable to install a susceptor electric potential monitor 34 connected to the ground potential via resistances R1 and R2 so that the DC current due to the DC voltage superimposed on the lower electrode (the susceptor) 4 can flow to the ground through the susceptor electric potential monitor 34.

At this time, since the DC current flows to the ground through the susceptor electric potential monitor 34, it is possible to prevent the DC current from flowing across the semiconductor wafer W. The resistances R1 and R2 are for example about 5 MΩ and about 20 kΩ, respectively.

FIG. 8 indicates voltages applied to the lower electrode 4, which are measured by the susceptor electric potential monitor 34 while changing a high frequency power from 800 W to 2350 W and a DC voltage superimposed on the lower electrode 4 from 0 V to −1000 V.

As divided by a bold line in FIG. 8, larger voltages than the DC voltage superimposed on the lower electrode 4 were measured in a section (a left/lower section) below the bold line. Therefore, in this section, an abnormal discharge appears to occur between the semiconductor wafer W and the lower electrode 4.

Meanwhile, voltages equal to the DC voltage superimposed on the lower electrode 4 were measured in a section above the bold line. Thus, in this section, the above-described abnormal discharge is not expected to occur.

However, in case the superimposed DC voltage is considerably larger than the electric potential Vdc on the semiconductor wafer W, there is also a possibility of an occurrence of the abnormal discharge.

Figure 9:
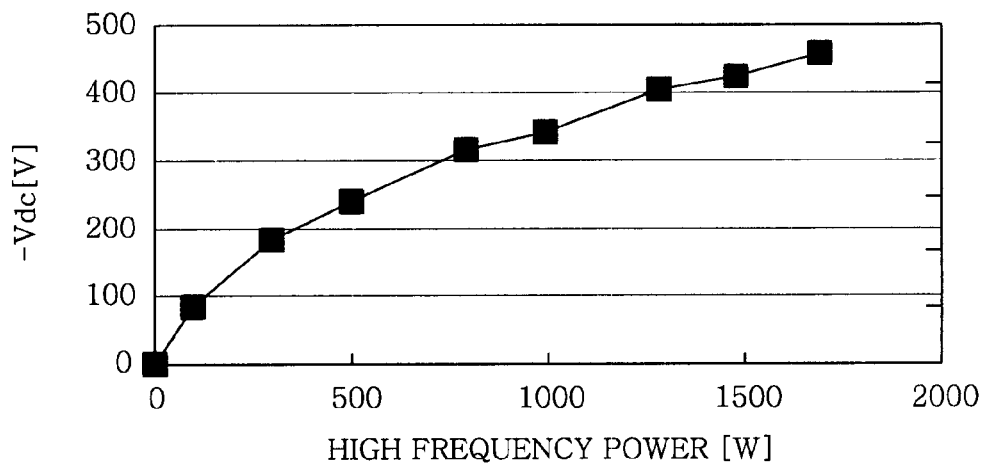
FIG. 9 illustrates a relationship between a high frequency power and an electric potential of a wafer surface.

It can be seen from FIG. 8 that the high frequency power is increased, the DC voltage superimposed on the lower electrode 4 needs to be increased. Further, it can be seen that it is preferable to apply the DC voltage of about −500 V when the high frequency power is not greater than 2350 W. FIG. 9 is a graph for showing a measurement result of a relationship between a high frequency power and a surface electric potential −Vdc of a semiconductor wafer. In FIG. 9, the X-axis and the Y-axis indicate the high frequency power (W) and the surface electric potential −Vdc(V), respectively. As shown in FIG. 9, as the high frequency power is increased, the surface electric potential −Vdc of the semiconductor wafer is also increased.

From the results shown in FIGS. 8 and 9, it can be seen that by superimposing a DC voltage corresponding to the surface electric potential −Vdc of the semiconductor wafer on the lower electrode (the susceptor) 4, it is possible to prevent the occurrence of the abnormal discharge between the semiconductor wafer W and the lower electrode (the susceptor) 4 as well as the occurrence of the surface arcing on the surface of the semiconductor wafer W.

It is preferable to store in advance the relationship between the high frequency power and the surface electric potential −Vdc of the semiconductor wafer W as table data and to determine a DC voltage to be superimposed on the lower electrode 4 when applying the high frequency power based on the table data.

Figure 10:
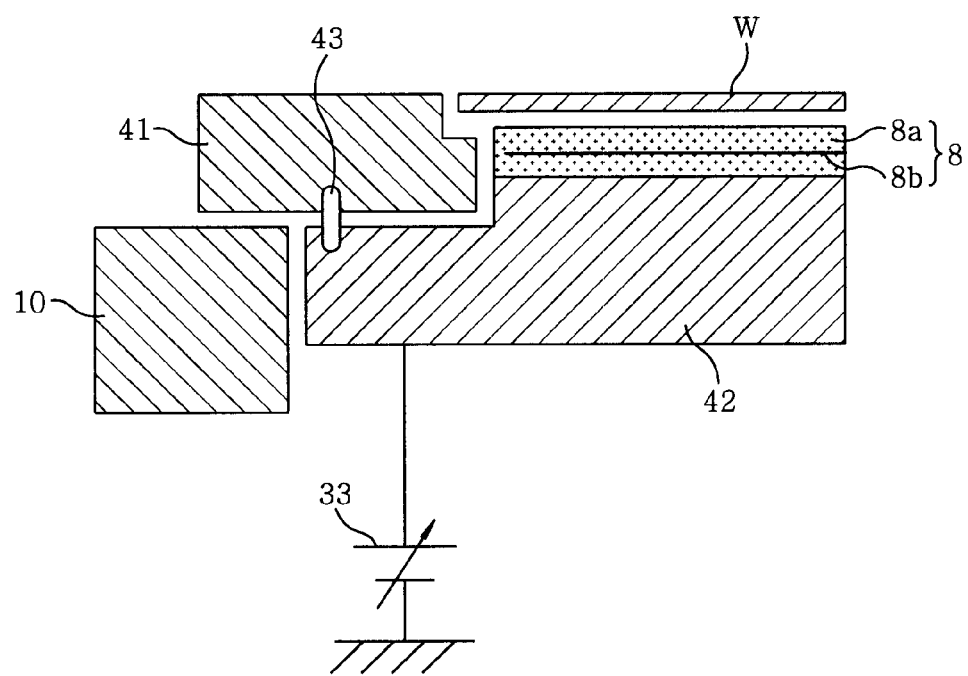
FIG. 10 schematically shows an enlarged view of principal parts of a plasma etching apparatus in accordance with another preferred embodiment.

FIG. 10 schematically shows an enlarged view of principal parts of a plasma etching apparatus in accordance with a third preferred embodiment of the present invention. As illustrated in FIG. 10, a focus ring 41 is electrically connected to a lower electrode 42 which serves as a susceptor made of aluminum or the like through a pin 43 made of a conductive metal such as aluminum, so that electric charges of the lower electrode 42 are fed to the focus ring 41 via the pin 43. At this time, the focus ring 41 and the lower electrode 42 are electrically connected by the pin 43 whose end portions are respectively buried in blind holes formed in facing surfaces of the focus ring 41 and the lower electrode 42.

In a conventional plasma etching apparatus, a small gap was formed between the focus ring 41 and the lower electrode 42. However, in this preferred embodiment, electric charges of the lower electrode 42 are supplied to the focus ring 41 via the pin 43, thereby controlling an electric potential of the focus ring 41. The third preferred embodiment shown in FIG. 10 has a same configuration as that of the first preferred embodiment illustrated in FIG. 2 except that the focus ring 41 is electrically connected to the lower electrode 42 by the pin 43. Therefore, like reference numerals will be given to like parts in FIGS. 2 and 10, and a redundant description thereof will be omitted.

Further, although the pin 43 is made of aluminum Al in this preferred embodiment, other conductive materials may also be used.

As a result of measuring an effect of this preferred embodiment under the same conditions as those of the first preferred embodiment, an electric potential difference between the semiconductor wafer W and the focus ring 41 and an incidence rate of a surface arcing were found to be decreased in comparison with the conventional apparatus without using the pin 43.

Figure 11:
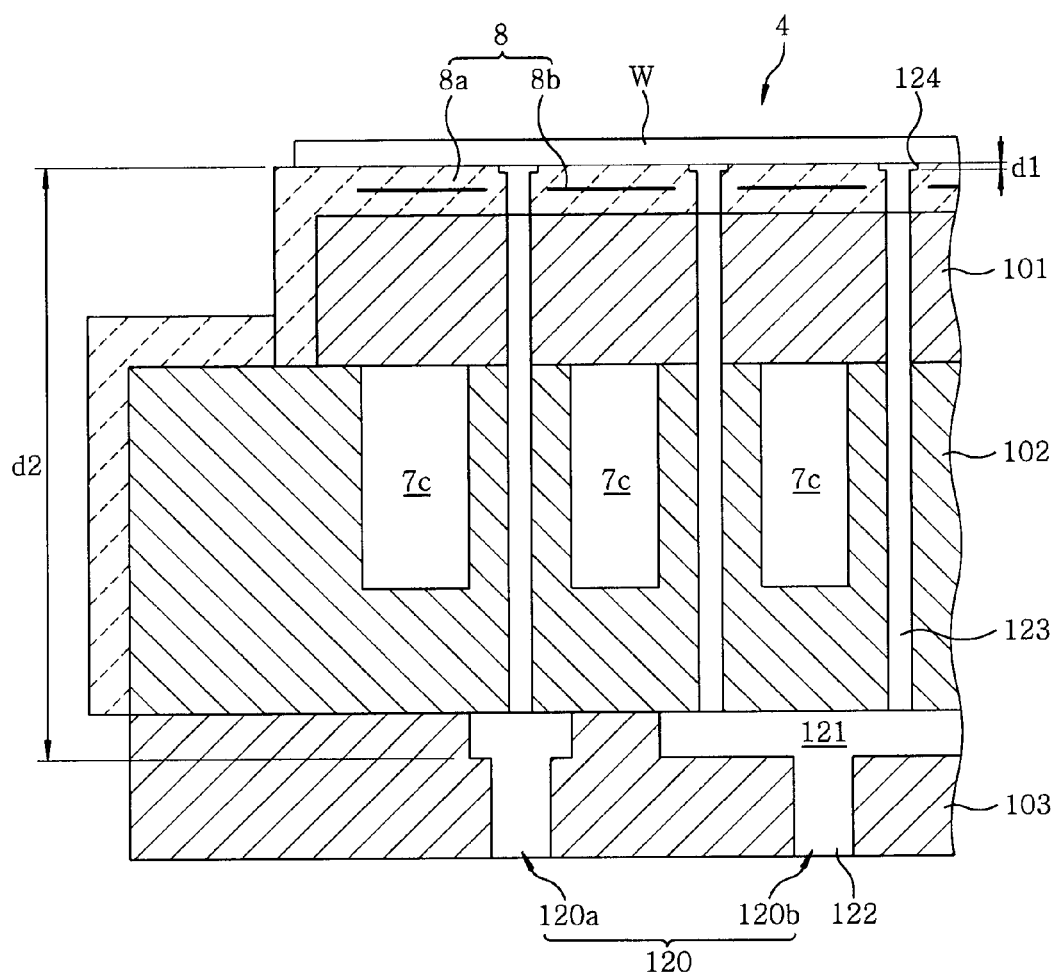
FIG. 11 schematically illustrates an enlarged view of principal parts of a plasma etching apparatus in accordance with another preferred embodiment.

FIG. 11 provides an enlarged view of principal parts of a plasma etching apparatus in accordance with a fourth preferred embodiment of the present invention. As illustrated in FIG. 11, the electrostatic chuck 8 for adsorptively supporting a semiconductor wafer W is installed on the lower electrode (the susceptor) 4 for mounting the semiconductor wafer W thereon. The electrostatic chuck 8 is formed of a dielectric layer 8a made of a thermally sprayed ceramic film such as $Al_2O_3$ and an electrode of electrostatic chuck 8b made of tungsten or the like disposed in the dielectric layer 8a. The semiconductor wafer W is attracted by the Coulomb force or the Johnson-Rahbeck force obtained by applying a high DC voltage to the electrostatic chuck electrode 8b.

Installed inside the lower electrode 4 are a coolant path 7c for circulating a coolant and a gas channel 120 for supplying a cooling gas such as a He gas, an Ar gas, a $SF_6$ gas and a $Cl_2$ gas. The gas channel 120 is of a dual system of a peripheral portion gas channel 120a and a central portion gas channel 120b in order to change respective pressures of the cooling gas supplied from the peripheral portion and the central portion of the semiconductor wafer W, respectively.

The lower electrode 4 of an approximately circular disc shape is made of a metal, e.g., aluminum having an anodic oxidized (alumite-treated) surface. Further, the lower electrode 4 is embodied by jointing three members, i.e., an upper plate 101, an intermediate plate 102, and a lower plate 103 (each having an approximately circular disc shape). The coolant path 7c is formed by blocking an opening of a groove formed in a top surface of the intermediate plate 102 by the upper plate 101.

The gas channel 120 has a gas storage 121 formed inside the lower electrode 4; a gas inlet circular hole 122 for introducing a gas from a bottom portion of the lower electrode 4 into the gas storage 121; and a plurality of gas supply fine holes 123 for supplying the gas from the gas storage 121 to a backside of the semiconductor wafer W.

The gas storage 121 is formed by blocking an opening of a groove formed in a top surface of the lower plate 103 by the intermediate plate 102. The plurality of gas supply fine holes 123 are formed through the intermediate plate 102 and the upper plate 101 so that the gas storage 121 can communicate with a mounting surface of the lower electrode 4.

Thus, the gas storage 121 is installed under the coolant path 7c inside the lower electrode 4.

Further, a plurality of fine grooves 124 matching with the gas supply fine holes 123 are formed on the mounting surface of the lower electrode 4 to diffuse the cooling gas.

At this time, it is needed to prevent a burr from being formed at the gas supply fine holes 123. In other words, when forming the gas supply fine holes 123 from one end thereof through a plate by using a drill or the like, a burr can be formed at an end surface of the plate. However, by forming in advance holes having diameters equal to or larger than those of the fine holes at the end surface of the plate, no burr will be formed thereat, thereby preventing an abnormal discharge due to the burr.

A seal member such as an O-ring is provided at joint portions between the plates so as to prevent an unnecessary flow of the cooling gas. Further, sealing surfaces thereof are formed to have prominences and depressions, respectively, for the purpose of securing a sufficient air-tightness. In this case, since an abnormal discharge may occur at locations on the concave/convex sealing surfaces to which no alumite is adhered, it is preferable to make a surface roughness Ra of the sealing surfaces be smaller than or equal to 0.5.

When the electrostatic chuck electrode 8b is formed by thermally spraying tungsten, tungsten is adhered to side surfaces of the gas supply fine holes 123 and/or a bottom surface of the gas storage 121. For this reason, a silicon coating is performed on inner surfaces of the gas supply fine holes 123 and/or the gas storage 121 in advance, so that the adhered tungsten can be removed by way of an ultrasonic cleaning with pure water.

Figure 12:
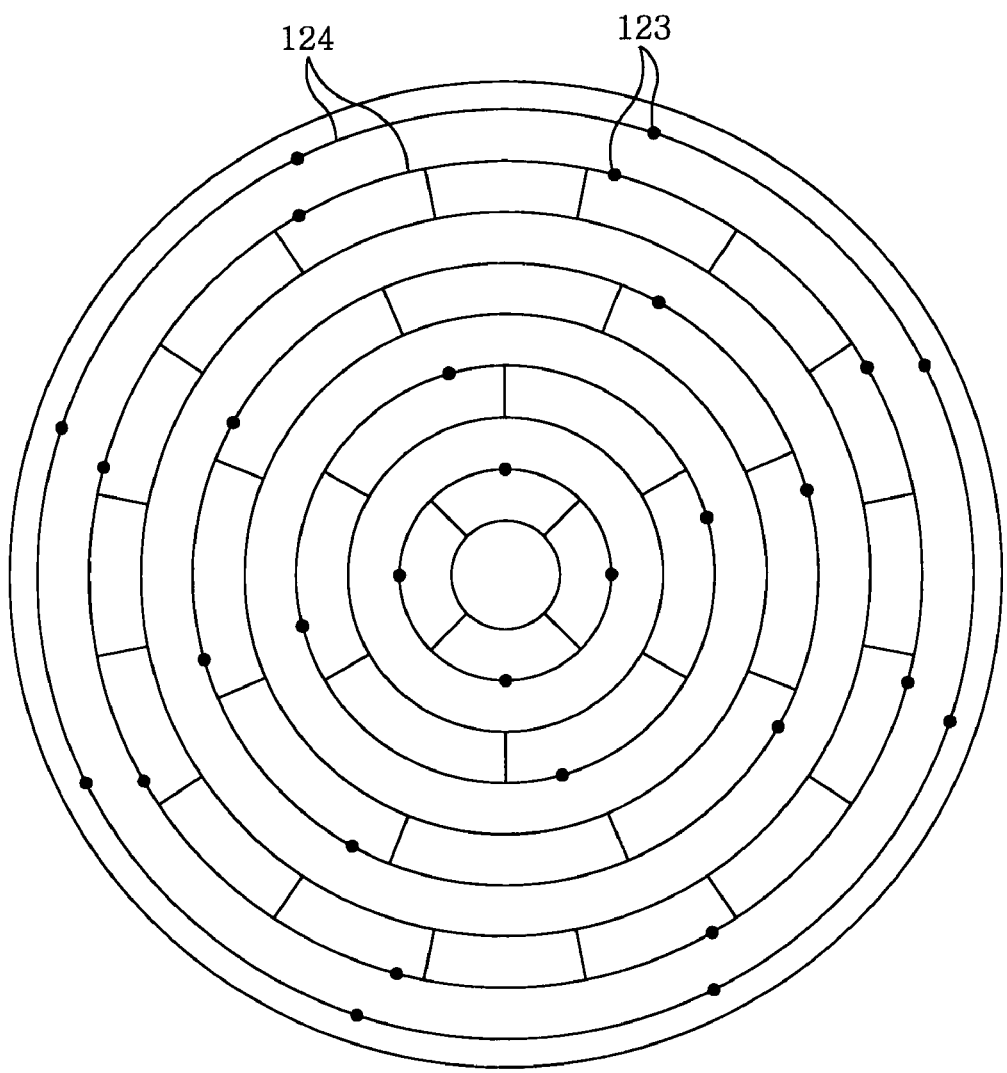
FIG. 12 schematically depicts a configuration of principal parts of the plasma etching apparatus of FIG. 11.

FIG. 12 presents an exemplary pattern of the fine grooves 124. In this example shown in FIG. 12, nine fine grooves 124 are formed in a concentric circular pattern. Among the nine fine grooves 124, an outermost fine groove 124 is connected to the aforementioned peripheral portion gas channel 120a. The other eight fine grooves 124 are connected to the central portion gas channel 120b and every two adjacent fine grooves 124 of them are paired to communicate with each other as a pair through the fine grooves 124 formed in radial directions.

The pattern of the fine grooves 124 can be varied without being limited to the above example as long as the cooling gas can be uniformly supplied to the backside of the semiconductor wafer W.

In this preferred embodiment, a depth of the fine grooves 124 (indicated as d1 in FIG. 11) is smaller than or equal to 1 mm, e.g., about 100 μm. Further, a distance between the mounting surface and the bottom portion of the gas storage 121 (indicated as d2 in FIG. 11) is greater than or equal to 10 mm, e.g., about 25 mm. The reasons thereof are as follows.

Figure 13:
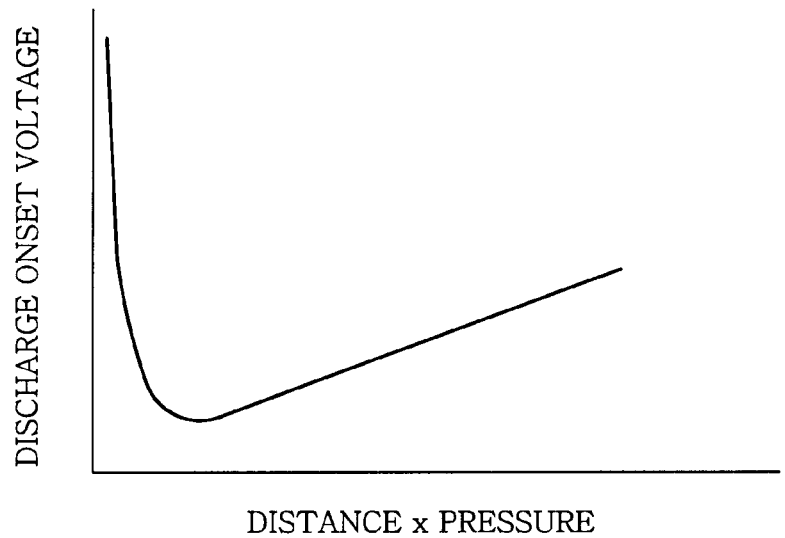
FIG. 13 provides a diagram for explaining the Paschen curve.

FIG. 13 shows a relationship between distance×pressure and a discharge onset voltage between two points that are represented by the X-axis and the Y-axis, respectively. The relationship thereof is indicated by a V-shaped curved line which is generally referred to as the Paschen curve. In case the cooling gas such as a He gas is supplied under a pressure ranging from, e.g., about 133 to 266 Pa, a distance corresponding to the lowest point of the Paschen curve is a few millimeters (e.g., about 4 mm).

Therefore, by setting d1 to be smaller than or equal to 1 mm (e.g., about 100 μm) and d2 to be greater than or equal to 10 mm (e.g., about 25 mm), the discharge can be prevented from occurring therebetween.

Figure 20:
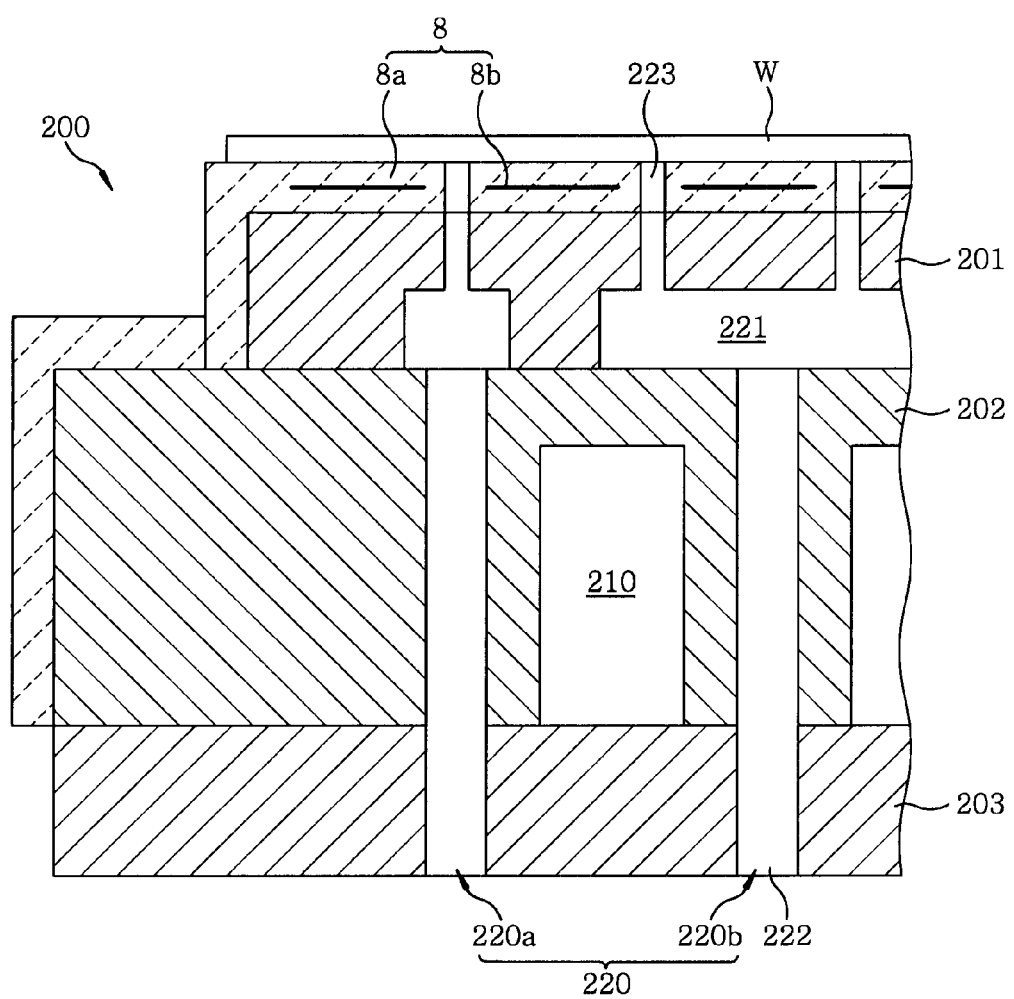
FIG. 20 schematically shows an enlarged view of principal parts of another conventional plasma processing apparatus.

In this preferred embodiment, the lower electrode 4 is controlled at a predetermined temperature by circulating a coolant within the coolant path 7c. Since the coolant path 7c is installed near the mounting surface of the lower electrode 4 in comparison with the apparatus illustrated in FIG. 20, a temperature of the semiconductor wafer W can be efficiently and precisely controlled.

The cooling gas is introduced from the gas inlet circular hole 122 into the gas storage 121 to be collected therein and then supplied therefrom to the backside of the semiconductor wafer W through each of the gas supply fine holes 123. At this time, since the cooling gas is diffused through the fine grooves 124, the cooling gas can be uniformly supplied throughout a wide range of the backside of the semiconductor wafer W. Thus, with the effect of the cooling gas, it is possible to control a temperature of the semiconductor wafer W more efficiently and precisely.

As described above, the gas channels 120 are formed such that a surface thereof facing the backside of the semiconductor wafer W is not located at a position making a distance therebetween close to that of the lowest point of the Paschen curve, thereby reducing a possibility of an undesired discharge therebetween.

The distance relationship with the backside of the semiconductor wafer W can be applied to substrate support members, e.g., pins, for supporting and lifting the semiconductor wafer W. The following is a description of a fifth preferred embodiment of the present invention.

Figure 14:
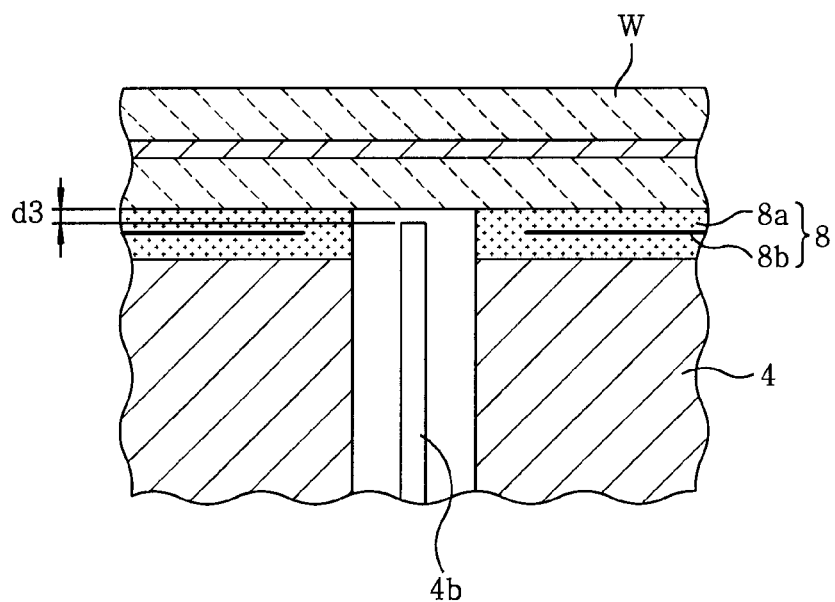
FIG. 14 schematically describes an enlarged view of the principal part of the plasma etching apparatus of FIG. 11.

As shown in FIG. 14, installed inside the lower electrode 4 is, e.g., a plurality of (normally three) pins 4b as substrate support members for supporting and lifting the semiconductor wafer W. The pins 4b are protruded beyond the lower electrode 4 to support the semiconductor wafer W above the lower electrode 4.

Figure 15:
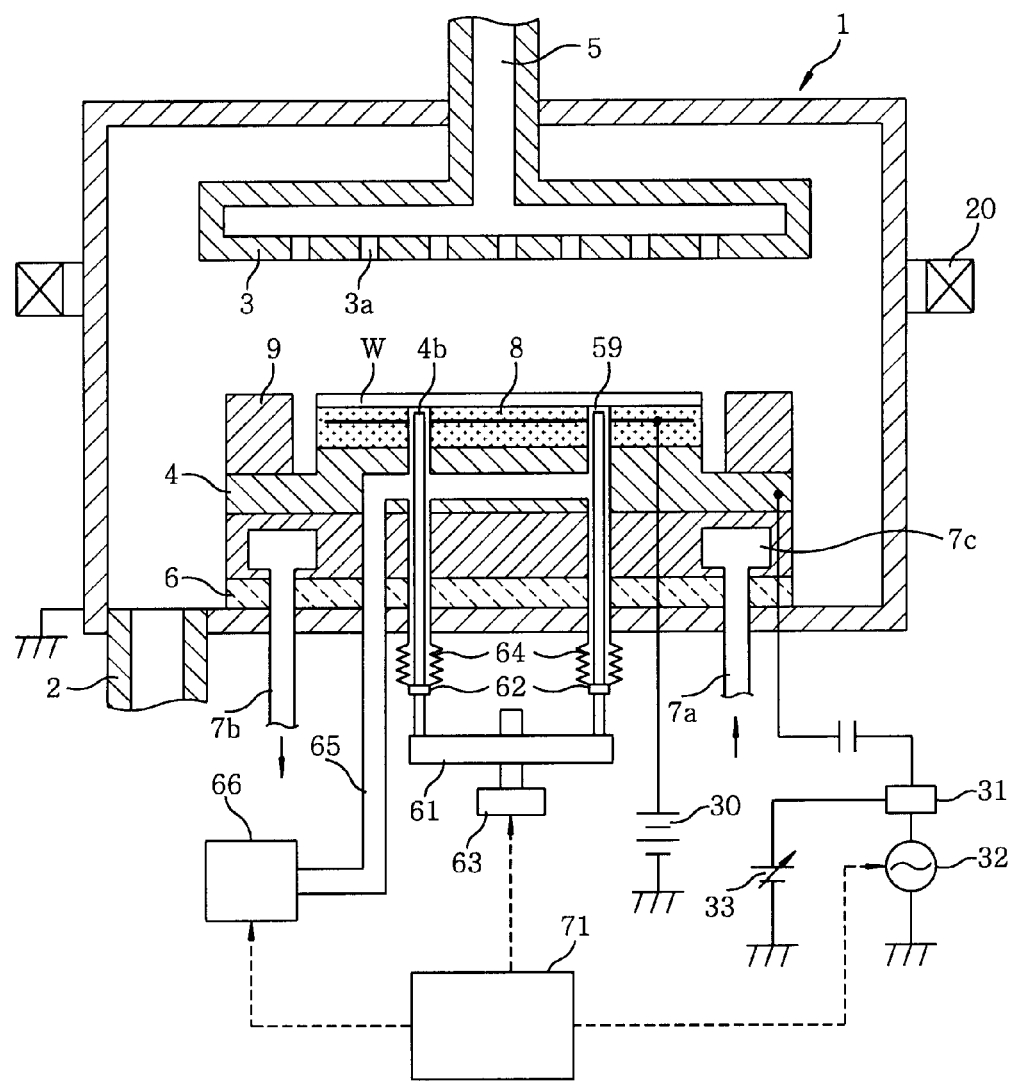
FIG. 15 schematically shows an overall configuration of a plasma etching apparatus in accordance with further preferred embodiment.

As illustrated in FIG. 15, each bottom portion of the pins 4b is fixed to a support 62 of a vertically movable plate 61 outside the etching chamber 1. The vertically movable plate 61 is vertically driven by a driving mechanism such as a pulse motor. Therefore, when the vertically movable plate 61 is moved upward and downward by the driving mechanism 63, each of the pins 4b moves upward and downward so that a top portion thereof can be protruded from a surface of the electrostatic chuck 8 or placed into one of thermally conductive medium channels 59. Herein, an air cylinder or the like can be used as the driving mechanism 63.

Bellows 64 are respectively installed between supports 62 of the vertically movable plate 61 and an outer bottom surface of the etching chamber 1. By of the bellows 64, the respective thermally conductive medium channels 59 serving as vertical movement channels of one of the pins 4b can be air tightly sealed. The thermally conductive medium channels 59 are connected to a gas supply line 65 introduced into the lower electrode 4 from an outside of the etching chamber 1 through an insulating plate 6. When a separately installed gas supply system 66 equipped with a mass flow controller supplies, e.g., a He gas into the gas supply line 65, a cold heat of the coolant is thermally conducted to the He gas via the lower electrode 4. Then, the cooled He gas is supplied to a surface of the electrostatic chuck 8 through the thermally conductive medium channels 59. As a result, the semiconductor wafer W can be controlled to be kept at any temperature ranging from, e.g., 150° C. to −50° C.

The discharge may occur between the pins 4b and the backside of the semiconductor wafer W and, therefore, it is preferable to set a distance d3 between a top end of each of the pins 4b and the backside of the semiconductor wafer W to be equivalent to the aforementioned distance [smaller than or equal to 1 mm (e.g., about 100 μm) or greater than or equal to 10 mm (e.g., about 25 mm)] under certain etching conditions.

Further, since the above-described Paschen curve varies depending on a gas pressure and/or a gas species, a proper selection of the distance is required depending on a type and/or a pressure of a cooling gas and it is required to secure a condition where an electric potential difference between each top end of the pins 4b and the backside of the semiconductor wafer W is sufficiently smaller than a discharge onset voltage determined by the Paschen curve.

By setting the distance d3 between each top end of the pins 4b and the backside of the semiconductor wafer W not to be in a range close to the lowest point of the Paschen curve, the abnormal discharge can be prevented from occurring between the semiconductor wafer W and the pins 4b. Further, by preventing the abnormal discharge on the backside of the semiconductor wafer W, an occurrence of an arcing on a front surface of the semiconductor wafer W can also be prevented.

Referring to FIG. 15, a controller 71 is electrically connected to the high frequency power supply 32, the driving mechanism 63 and the gas supply system 66 including a mass flow controller. The controller 71 controls at least one of a surface electric potential of the semiconductor wafer W, a distance between the backside of the semiconductor wafer W and each pin 4b and a pressure based on the Paschen curve, thereby preventing the abnormal discharge on the backside of the semiconductor wafer W.

Further, the surface electric potential of the semiconductor wafer W is determined by a high frequency power applied thereto. Therefore, by controlling the high frequency power supply 32, the surface electric potential of the semiconductor wafer W, i.e., an electric potential difference between the backside of the semiconductor wafer W and each top end of the pins 4b can be controlled.

While the pins 4b are inserted through the thermally conductive medium channels 59 in the example of FIG. 15, they may be inserted, instead, through holes provided only to facilitate up and down movements of the pins 4b. In this case, the He gas from the thermally conductive medium channels 59 passes through grooves formed on the electrostatic chuck 8 and then reaches to the holes through which the pins 4b make up and down movements. Therefore, a pressure between the backside of the semiconductor wafer W and the pins 4b becomes substantially equal to that in the thermally conductive medium channels 59.

Figure 16:
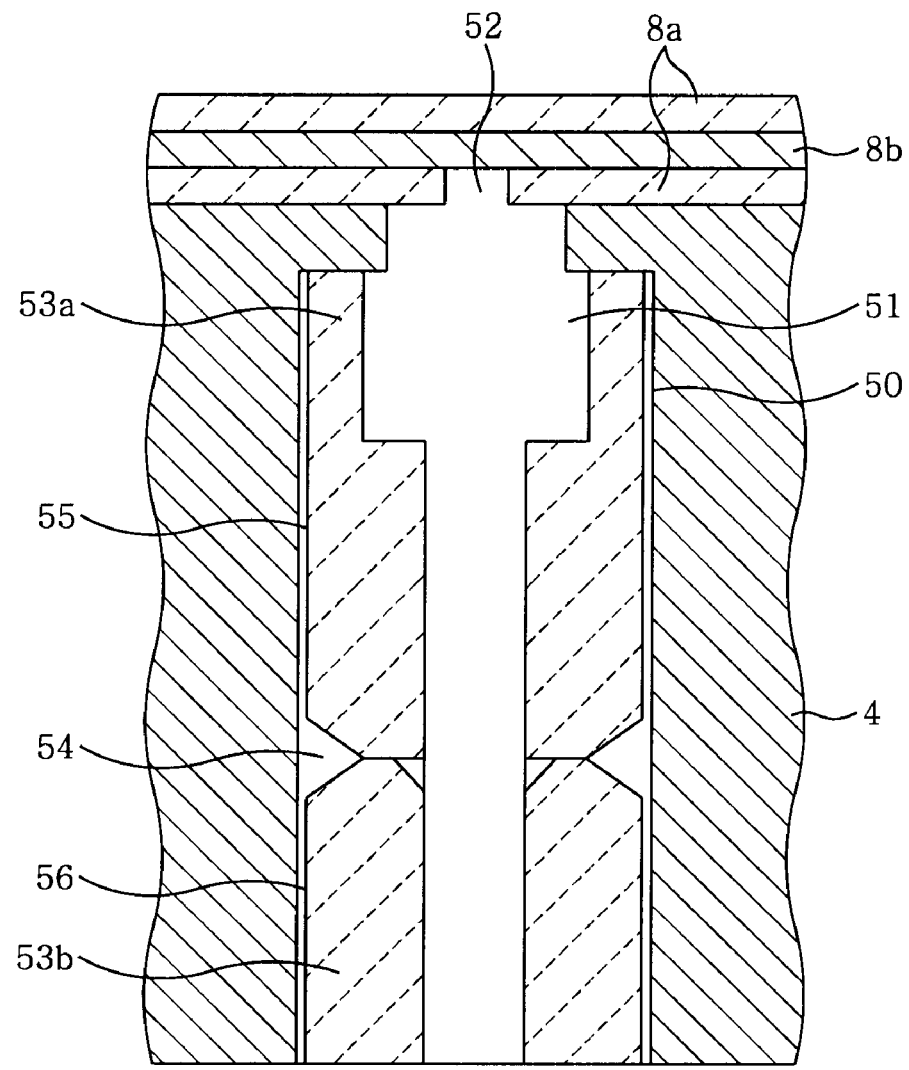
FIG. 16 schematically illustrates an enlarged view of principal parts of the plasma etching apparatus of FIG. 15.

As shown in FIG. 16, a connection between the electrostatic chuck electrode 8b and the DC power supply 30 is formed by inserting an HV pin 51 into a through hole 50 formed in the lower electrode 4 and making a conductive portion 52 provided at a leading end portion of the HV pin contact with the electrode of electrostatic chuck 8b. Further, an insulating material surrounding a periphery of the HV pin 51 has two parts, i.e., an insulating material 53a and an insulating material 53b, and a void 54 formed therebetween is filled with an adhesive. The insulating material 53a on the leading side is fixed to the support 2 and the HV pin 51 by using an epoxy-based adhesive while the insulating material 53b on the trailing side is fixed to the support 4 and the HV pin 51 by using a silicone-based adhesive 56.

With the two types of adhesives, the epoxy-based adhesive 55 of a strong adhesive force can firmly fix the HV pin 51, while the silicone-based adhesive can securely vacuum seal the through hole 50. Furthermore, by filling the silicone-based adhesive 56 into the void 54, the vacuum sealing can be further securely obtained.

Hereinafter, a configuration of a plasma etching apparatus in accordance with a sixth preferred embodiment of the present invention will be described with reference to FIGS. 17 and 18.

Figure 17:
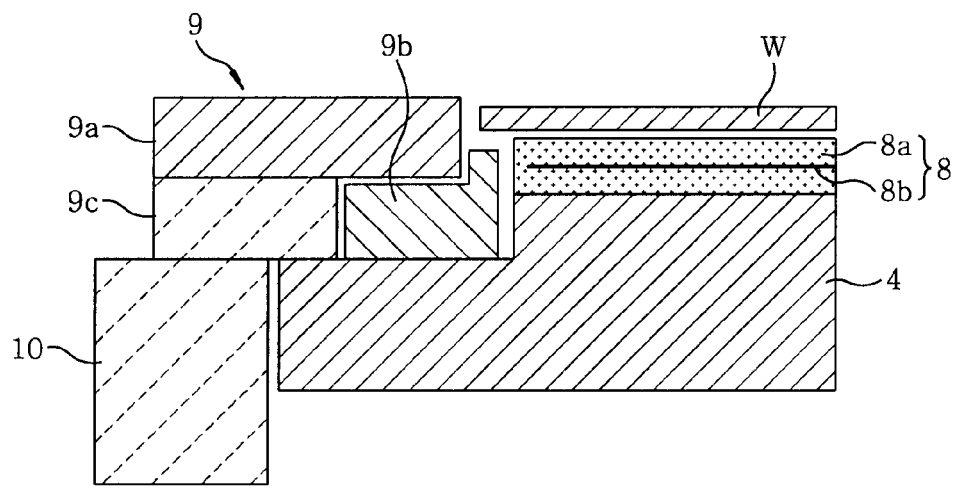
FIG. 17 schematically depicts an enlarged view of principal parts of a plasma etching apparatus in accordance with still further preferred embodiment.
Figure 18:
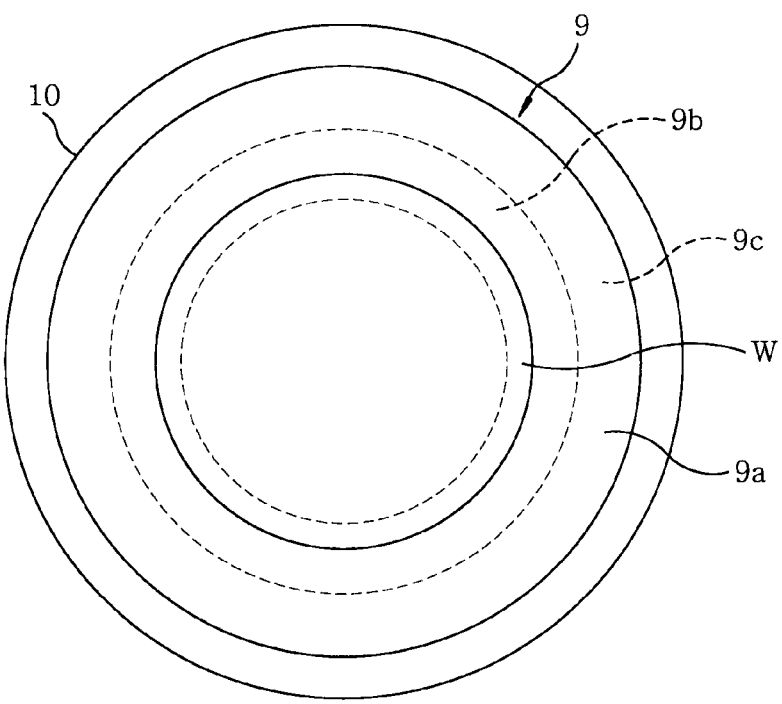
FIG. 18 schematically describes a configuration of the principal part of the plasma etching apparatus of FIG. 17.
Figure 19:
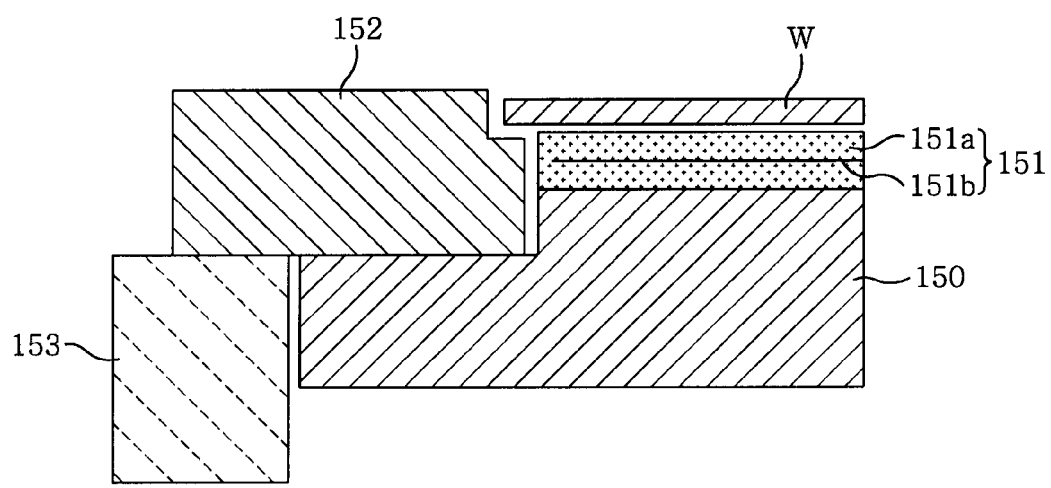
FIG. 19 schematically illustrates an enlarged view of principal parts of a conventional plasma processing apparatus.

FIGS. 17 and 18 schematically depict a configuration of principal parts near a focus ring 9 of the plasma etching apparatus in accordance with the sixth preferred embodiment of the present invention. Specifically, FIG. 17 shows an enlarged vertical sectional view of the principal parts of the focus ring 9, and FIG. 18 provides a top view of the entire focus ring 9.

As can be seen from FIGS. 17 and 18, the focus ring 9 includes three ring-shaped members of an upper ring 9a having a top surface facing a plasma, an inner ring 9b installed at an inner region under the upper ring 9a, and an outer ring 9c provided outside of the inner ring 9b.

The upper ring 9a and the inner ring 9b among the three ring members are made of silicon, silicon carbide, silicon dioxide or the like. The outer ring 9c is made of an insulating material, e.g., quartz.

A height of the outer ring 9c is set to be slightly greater than that of the inner ring 9b. Accordingly, when the upper ring 9a is placed on the outer ring 9c, there will be a small gap (e.g., about 0.025 mm to about 0.075 mm) between a bottom surface of the upper ring 9a and a top surface of the inner ring 9b. With such an arrangement, the upper ring 9a and the inner ring 9b do not make a contact with each other, thereby preventing them from being at a same electric potential.

The focus ring 9 of the above configuration is disposed on a peripheral portion of the lower electrode 4 made of aluminum or the like and the insulating member 10 surrounding the peripheral portion thereof.

In the plasma etching apparatus having the above-described focus ring 9, when an etching process is performed by using a plasma, electric charges are accumulated on the semiconductor wafer W and the focus ring 9, thereby generating an electric potential difference. As described above, however, the focus ring 9 in this preferred embodiment includes the upper ring 9a, the inner ring 9b and the outer ring 9c.

Therefore, in comparison with a case where a focus ring is made in a single body, an impedance of the entire focus ring is increased due to the inserted outer ring 9c made of an insulating material.

An electric potential difference $V_{tb}$ between the upper ring 9a and the inner ring 9b is configured to be greater than an electric potential difference $V_{tw}$ between the upper ring 9a and the semiconductor wafer W. Further, a gap distance $d_{tw}$ between the upper ring 9a and the semiconductor wafer W and a gap distance $d_{td}$ between the upper ring 9a and the inner ring 9b are arranged to satisfy a relationship given as $d_{td} \ll d_{tw}$. Therefore, even if a discharge occurs, there occurs no discharge between the upper ring 9a and the semiconductor wafer W occurring, but the discharge does definitely occur between the upper ring 9a and the inner ring 9b.

That is, since the discharge occurs only between the upper ring 9a and the inner ring 9b, a discharge (a surface arcing) is surely prevented from occurring between the upper ring 9a and the semiconductor wafer W.

By using, as the above-described semiconductor wafer W, a semiconductor wafer W having an underlying layer (an insulating layer) formed at a surface thereof, a metal layer formed on the underlying layer and an insulating layer of a silicon oxide film layer on the metal layer and employing, as an etching gas, a gaseous mixture of $C_4F_8$ (flow rate of 10 sccm), CO (flow rate of 50 sccm), Ar (flow rate of 200 sccm), and $O_2$ (flow rate of 5 sccm), an etching process for etching the silicon oxide film layer of the semiconductor wafer W was carried out under a condition of pressure of 5.99 Pa (45 mTorr) and a high frequency power of 1500 W to form a contact hole therein.

During the etching process, electric potentials of the semiconductor wafer, the upper ring 9a, and the inner ring 9b were respectively measured, resulting in electric potentials of the semiconductor wafer W, the upper ring 9a, and the inner ring 9b being −397 V, −393 V and −414 V, respectively.

No surface arcing occurred during the etching process.

As can be seen from the above result, by embodying the focus ring 9 with three ring-shaped members of the upper ring 9a, the inner ring 9b and the outer ring 9c in this preferred embodiment, the occurrence of the surface arcing could be prevented.

That is, in this preferred embodiment, it is possible to control the electric potential of the focus ring 9 so as to prevent a surface arcing without using the aforementioned electric potential control DC power supply 33.

Although the focus ring 9 is embodied by three ring-shaped members of the upper ring 9a, the inner ring 9b and the outer ring 9c in this preferred embodiment, the focus ring 9 may be divided into at least two parts, e.g., two ring-shaped members of the upper ring 9a and the inner ring 9b. Alternatively, the configurations of the inner ring 9b and the outer ring 9c may be interchanged with each other. That is, may be possible to dispose a conductive ring-shaped member on the outer side and an insulating ring-shaped member on the inner side.

Besides, although, in the above preferred embodiments, there has been described a case where the present invention is applied to the dipole magnetron plasma etching apparatus, the present invention may also be applied to other types of plasma processing apparatuses such as a plasma film coating apparatus, a plasma sputtering apparatus and a plasma ashing apparatus other than the plasma etching apparatus.

INDUSTRIAL APPLICABILITY

The plasma processing apparatus and the plasma processing method in accordance with the present invention may be used in a semiconductor manufacturing industry for manufacturing semiconductor devices and the like. Therefore, the present invention has an industrial applicability.

What is claimed is:

1. A plasma processing apparatus comprising:
a processing chamber configured to generate a plasma therein;
a susceptor, installed in the processing chamber, configured to mount a substrate to be processed thereon, the susceptor serving as an electrode; and
a focus ring disposed on a peripheral portion of the susceptor and configured to surround a periphery of the substrate,
wherein the focus ring mounted on the susceptor includes:
a first ring member having a surface exposed to the plasma;
a second ring member being disposed directly under the first ring member; and
a third ring member made of an electrically insulating material and configured to mount the first ring member thereon and to provide a small gap between the first ring member and the second ring member such that there is no direct electrical conductive contact established between the first ring member and the second ring member and an electrical potential of the first ring member is not equal to that of the second ring member,
wherein a portion of the third ring member is directly disposed on the susceptor,
wherein there is a gap between the second ring member and the third ring member,
wherein a portion of the second ring member is positioned above a bottom part of the first ring member and there is a gap between the first ring member and the portion of the second ring member, and
wherein the first ring member and the second ring member are made of an electrically conductive material.

2. The plasma processing apparatus of claim 1, wherein the third ring member is installed at a side of an outer circumference of the second ring member.

3. The plasma processing apparatus of claim 1, wherein the third ring member is installed at a side of an outer circumference of the second ring member, a bottom of a part of the first ring member is in direct contact with the third ring member, and the bottom part of the first ring member is disposed above a part of the second ring member with the gap therebetween.

4. The plasma processing apparatus of claim 1, wherein the first and the second ring member is made of at least one of silicon, silicon carbide, and silicon dioxide, and the third ring member is made of quartz.

5. The plasma processing apparatus of claim 1, wherein the second ring member is disposed on a peripheral portion of the susceptor made of aluminum, and the third ring member is disposed on both the peripheral portion of the susceptor and an insulating member surrounding the peripheral portion of the susceptor.

6. A plasma processing apparatus, comprising:
a processing chamber configured to generate plasma therein;
a susceptor, installed in the processing chamber, configured to mount a substrate to be processed thereon, the susceptor serving as an electrode; and
a focus ring disposed on a peripheral portion of the susceptor and configured to surround a periphery of the substrate,
wherein the focus ring mounted on the susceptor includes:
a first ring member having a surface exposed to the plasma,
a second ring member being disposed under the first ring member; and
a third ring member made of an electrically insulating material and configured to mount the first ring member thereon and to provide a small gap between the first ring member and the second ring member such that there is no electrical conductive contact established between the first ring member and the second ring member and an electrical potential of the first ring member is not equal to an electrical potential of the second ring member,
wherein a portion of the third ring member is directly disposed on the susceptor, there is a gap between the second ring member and the third ring member, a portion of the second ring member is positioned above a bottom part of the first ring member and there is a gap between the first ring member and the portion of the second ring member, and the first ring member and the second ring member are made of an electrically conductive material, and
the third ring member is installed at a side of an outer circumference of the second ring member, a bottom part of the first ring member being in direct contact with the third ring member, and the bottom part of the first ring member is disposed above a part of the second ring member with the gap therebetween.

7. The plasma processing apparatus according to claim 6, wherein each of the first and second ring members is made of at least one of silicon, silicon carbide, and silicon dioxide, and the third ring member is made of quartz.

8. The plasma processing apparatus of claim 6, wherein the second ring member is disposed on a peripheral portion of the susceptor made of aluminum, and the third ring member is disposed on both the peripheral portion of the susceptor and an insulating member surrounding the peripheral portion of the susceptor.

9. A plasma processing apparatus comprising:
a processing chamber configured to generate a plasma therein;
a susceptor, installed in the processing chamber, configured to mount a substrate to be processed thereon, the susceptor serving as an electrode; and
a focus ring disposed on a peripheral portion of the susceptor and configured to surround a periphery of the substrate,
wherein the focus ring mounted on the susceptor includes:
a first ring member having a surface exposed to the plasma;
a second ring member being disposed under the first ring member; and
a third ring member made of an electrically insulating material and configured to mount the first ring member thereon and to provide a small gap between the first ring member and the second ring member such that there is no direct electrical conductive contact established between the first ring member and the second ring member and an electrical potential of the first ring member is not equal to that of the second ring member,
wherein a portion of the third ring member is directly disposed on the susceptor,
wherein there is a gap between the second ring member and the third ring member,
wherein a portion of the second ring member is positioned above a bottom part of the first ring member and there is a gap between the first ring member and the portion of the second ring member,
wherein the first ring member and the second ring member are made of an electrically conductive material, and
wherein the second ring member is disposed on a peripheral portion of the susceptor made of aluminum, and the third ring member is disposed on both the peripheral portion of the susceptor and an insulating member surrounding the peripheral portion of the susceptor.

10. The plasma processing apparatus of claim 9, wherein the third ring member is installed at a side of an outer circumference of the second ring member.

11. The plasma processing apparatus of claim 9, wherein the third ring member is installed at a side of an outer circumference of the second ring member, a bottom of a part of the first ring member is in direct contact with the third ring member, and the bottom part of the first ring member is disposed above a part of the second ring member with the gap therebetween.

12. The plasma processing apparatus of claim 9, wherein each of the first and the second ring member is made of at least one of silicon, silicon carbide, and silicon dioxide, and the third ring member is made of quartz.

\* \* \* \* \*